(12) United States Patent
Griswold et al.

(10) Patent No.: US 9,470,767 B2
(45) Date of Patent: Oct. 18, 2016

(54) WIRELESS MAGNETIC FIELD MONITORING IN MAGNETIC RESONANCE IMAGING

(75) Inventors: Mark Griswold, Shaker Hts., OH (US); Matthew Riffe, Cincinnati, OH (US)

(73) Assignee: Case Western Reserve University, Cleveland, OH (US)

( * ) Notice: Subject to any disclaimer, the term of this patent is extended or adjusted under 35 U.S.C. 154(b) by 1034 days.

(21) Appl. No.: 13/444,911

(22) Filed: Apr. 12, 2012

(65) Prior Publication Data
US 2013/0271126 A1    Oct. 17, 2013

(51) Int. Cl.
| | | |
|---|---|---|
| G01R 33/58 | (2006.01) | |
| G01R 33/24 | (2006.01) | |
| G01R 33/36 | (2006.01) | |
| G01R 33/565 | (2006.01) | |

(52) U.S. Cl.
CPC ......... *G01R 33/243* (2013.01); *G01R 33/3692* (2013.01); *G01R 33/58* (2013.01); *G01R 33/56563* (2013.01); *G01R 33/56572* (2013.01)

(58) Field of Classification Search
USPC ........................... 600/407–435; 382/128–131
See application file for complete search history.

(56) References Cited

U.S. PATENT DOCUMENTS

| | | | | | |
|---|---|---|---|---|---|
| 2,878,443 | A | * | 3/1959 | Schuster | G01R 33/44 324/314 |
| 3,173,082 | A | * | 3/1965 | Bell | G01N 24/00 324/304 |
| 4,694,254 | A | * | 9/1987 | Vatis | G01R 33/3607 324/309 |
| 8,049,500 | B2 | | 11/2011 | Griswold et al. | |
| 2013/0027034 | A1 | * | 1/2013 | Elgort | G01R 33/26 324/301 |
| 2013/0271126 | A1 | * | 10/2013 | Griswold et al. | ............. 324/301 |

OTHER PUBLICATIONS

Onodera, T., Matsui, S., Sekihara, K. & Kohno, H. A Method of Measuring Field-Gradient Modulation Shapes. Application to high-speed NMR spectroscopic imaging. Journal of physics E: Scientific Instruments 20:416 (1987).
Heron, M. et al. National Vital Statistics Reports Deaths: Final Data for 2006. National Vital Statistics Reports57, (2009).
Pavan, M., Vannesjo, S.J., Barmet, C., Brunner, D. & Pruessmann, K.P. Frequency-division multiplexing for concurrent imaging and field monitoring. Proceedings of the 18th Scientific Meeting, International Society of Magnetic Resonance in Medicien 187, 153 8 (2010).
http://www.eecs.umich.edu/~fessler/code/.
Seiberlich, N. et al. Improved Temporal Resolution in Cardiac Imaging Using Through-Time Spiral GRAPPA. Magnetic Resonance in Medicine (2011).doi:10.1002/mrm.22952.

(Continued)

*Primary Examiner* — Melissa Koval
*Assistant Examiner* — Tiffany Fetzner
(74) *Attorney, Agent, or Firm* — Quarles & Brady LLP

(57) ABSTRACT

Apparatus, methods, and other embodiments associated with wireless magnetic field monitoring (wMFM) in magnetic resonance imaging (MRI) are described. One example apparatus includes a wMFM module configured to receive an MFM signal from an MFM probe and to wirelessly transmit modulated MFM signals produced from the received MFM signals to an MRI apparatus. The MRI apparatus is configured with a wireless receiver that receives and processes the modulated MFM signals into information used in an image reconstruction. The MRI apparatus includes an MRI reconstruction logic configured to produce an MR image from the MRI signal based, at least in part, on the magnetic field measurement information.

8 Claims, 13 Drawing Sheets

(56) References Cited

OTHER PUBLICATIONS

Alley, M.T., Glover, G.H. & Pelc, N.J. Gradient Characterization Using a Fourier-Transform Technique. Magnetic Resonance in Medicine 39:581-7 (1998).

Beaumont, M., Lamalle, L., Segebarth, C. & Barbier, E.L. Improved k-Space Trajectory Measurement with Signal Shifting. Magnetic Resonance in Medicine 58:200-205 (2007).

Duyn, J.H., Yang, Y., Frank, J.A. & van der Veen, J.W. Simple Correction Method for k-Space Trajectory Deviations in MRI. Journal of Magnetic Resonance 132, 150-153 (1998).

Mason, G.F. et al. A Method to Measure Arbitrary k-Space Trajectories for Rapid MR Imaging. Magnetic Resonance in Medicine 38:492-496 (1997).

Twieg, D.B. The k-trajectory formulation of the NMR imaging process with applications in analysis and synthesis of imaging methods. Med. Phys. 10:610-621 (1983).

Zhang, Y., Hetherington, H.P., Stokely, E.M., Mason, G.F. & Twieg, D.B. A Novel k-Space Trajectory Measurement Technique. Magnetic Resonance in Medicine 39:999-1004 (1998).

Barmet, C., Zanche, N.D. & Pruessmann, K.P. Spatiotemporal Magnetic Field Monitoring for MR. Magnetic Resonance in Medicine 60:187-197 (2008).

De Zanche, N., Barmet, C., Nordmeyer-Massner, J.A. & Pruessmann, K.P. NMR Probes for Measuring Magnetic Fields and Field Dynamics in MR Systems. Magnetic Resonance in Medicine 60:176-186 (2008).

Barmet, C., De Zanche, N., Wilm, B.J. & Pruessmann, K.P. A Transmit/Receive System for Magnetic Field Monitoring of In Vivo MRI. Magnetic Resonance in Medicine 62:269-276 (2009).

Sipila, P., Greding, S., Wachutka, G. & Wiesinger, F. 2H Transmit-Receive NMR Probes for Magnetic Field Monitoring in MRI. Magnetic Resonance in Medicine 65:1498-1506 (2011).

Sipila, P., Schulte, R.F., Wachutka, G. & Wiesinger, F. Digital Multiband Receiver for Magnetic Resonance. Concepts in Magnetic Resonance Part B: Magnetic Resonance Engineering 35:210-220 (2009).

Riffe, M.J., Heilman, J.A., Gudino, N. & Griswold, M.A. Using On-Board Microprocessors to Control a Wireless MR Receiver Array. Proceedings of the International Society of Magnetic Resonance in Medicine 17:2936 (2009).

Lechner, S.M., Sipila, P.T., Wiesinger, F., Kerr, A.B. & Vogel, M.W. Spiral Imaging Artifact Reduction: A Comparison of Two k-Trajectory Measurement Methods. Journal of Magnetic Resonance Imaging 29:1485-1492 (2009).

Ahn, C.B., Kim, J.H. & Cho, Z.H. High-Speed Spiral-Scan Echo Planar NMR Imaging. IEEE Transactions on Medical Imaging 5:2-7 (1986).

Sipila, P. et al. Robust, Susceptibility-matched NMR probes for compensation of magnetic field imperfections in magnetic resonance imaging (MRI). Sensors and Actuators A: Physical 145-146:139-146 (2008).

\* cited by examiner

WIRELESS MAGNETIC FIELD MONITORING IN MAGNETIC RESONANCE IMAGING

BACKGROUND

Some magnetic resonance imaging (MRI) techniques are pushing MRI apparatus towards their performance limits. Acquisition techniques that operate near the limits may be sensitive to small gradient field perturbations that may create image artifacts. Some conventional MRI acquisitions can successfully rely on a long-standing assumption that the gradient field produced by an MRI apparatus accurately matches the gradient field that was intended to be produced by the MRI apparatus. These conventional MRI acquisitions can rely on the assumption because small field perturbations may be tolerated in image reconstruction. However, some MRI acquisitions that push the MRI apparatus towards their performance limits may not rely on the assumption because even small field perturbations may produce unacceptable artifacts that cannot be tolerated in image reconstruction.

Magnetic field monitoring (MFM) is known to MRI. In theory, MFM can be employed to measure magnetic field perturbations directly and thus can be employed to account for (e.g., correct) artifacts produced by the magnetic field perturbations. While MFM is theoretically able to produce these results, practical implementations of MFM have faced several challenges. For example, conventional MFM has employed a network of miniature MRI coils with highly localized sensitivities to measure the magnetic field evolutions at different spatial locations. If the spatial locations have an appropriate spatial distribution, then the field dynamics can be calculated accurately in an imaging volume. But the network of small coils requires extra cabling, circuitry, and other equipment that may be difficult to accommodate.

Some conventional MFM systems may have relied on an NMR signal from hydrogen to monitor magnetic field dynamics. But for MFM to work, the MFM signal can only come from the local signal source (e.g., MFM probe). If there is any coupling between the MFM signal from different probes in different spatial locations, or if there is any coupling between MFM signal and an NMR signal from an imaging subject, then the MFM system will produce incorrect measurements. Conventional MFM systems may, therefore, have tried to reduce the likelihood of coupling between signals for different probes by spacing probes far apart.

Receive only arrays for MFM have limitations. Therefore, some conventional MFM systems have employed an array of hetero-nuclear transceiver probes to address these limitations. Unfortunately, using an array of hetero-nuclear transceiver probes introduces a requirement for a separate, specialized, multi-frequency transceiver system that is able to acquire, process, and provide the MFM signals from the array of hetero-nuclear transceiver probes.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
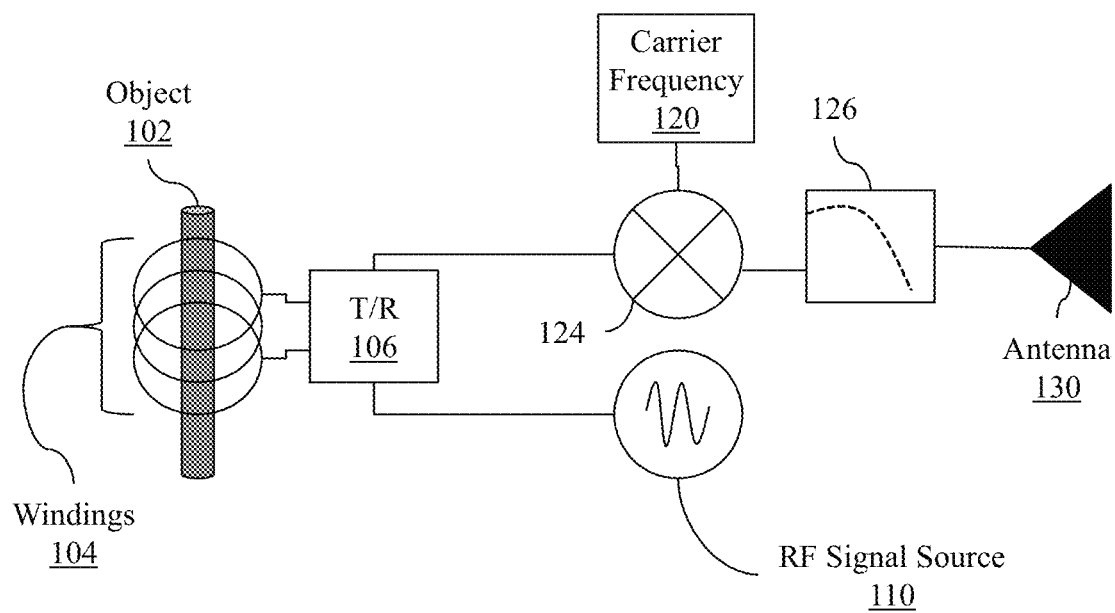
FIG. 1 illustrates an example circuit employed in wireless magnetic field monitoring (wMFM).

Example apparatus and methods concern wireless magnetic field monitoring (wMFM) in magnetic resonance imaging (MRI). Example apparatus and methods integrate data correction into an MRI reconstruction because the wMFM signal provides information from which the actual field present during an MRI acquisition can be determined as NMR signals intended for reconstruction are acquired.

Resonating nuclei produce NMR signals. These NMR signals can be detected by magnetic resonance (MR) receive coils. Conventionally, MR receive coils were connected to an MRI apparatus by wires or cables or other direct tangible connections. US Patent Publication 2010/0253331 describes receive coils that are "connected" to an MR apparatus using wireless transmissions. Example apparatus and methods may extend the functionality of generic wireless receive coils to accommodate additional MFM functionality. Recall that conventional MFM systems may have required a specialized multi-frequency receiver system. Extending the functionality of generic wireless receive coils that are already present in an NMR apparatus facilitates performing MFM without the additional specialized multi-frequency receiver system.

NMR signals intended for image reconstruction may be received in a receive coil, modulated with a carrier frequency, and then wirelessly provided to the MR apparatus. Example apparatus and methods may configure a receive coil with an additional circuit that is configured to receive MFM signals and to provide those MFM signals to the MR apparatus using wireless transmission. In one embodiment, the MFM signal may be provided to the NMR apparatus in real time, substantially simultaneously with the NMR signals intended for image reconstruction. Thus, example apparatus and methods may be configured to automatically perform image reconstruction using the contemporaneously provided MFM signals.

Spins in a magnetic field precess at a knowable frequency. The frequency is determined by the magnetic field as described by Larmor precession. Larmor precession describes how the angular momentum vector $\vec{j}$ precesses about the external field axis with an angular frequency:

$$\omega = -\gamma B$$

where $\omega$ is the angular frequency, $-\gamma$ is the gyromagnetic ratio, and B is the magnitude of the magnetic field. A spin that is initially precessing at one frequency may precess at a different frequency if the magnetic field changes.

Therefore, spins in an MFM probe can be excited at a first frequency $MFM_{F1}$ determined by a first magnetic field (e.g., $B_0$). These spins may precess at $MFM_{F1}$ while the first magnetic field remains constant and in place. However, these spins may precess at a second frequency $MFM_{F2}$ if the first magnetic field changes to a second magnetic field. MRI pulse sequences use gradients to change magnetic fields during an acquisition. Therefore, MFM probes excited at an original frequency can provide information about actual magnetic fields being experienced during an image acquisition, where the actual fields are a function of the main magnetic field and the gradient field.

If the magnetic field varies spatially, then the MFM precession frequency will also vary spatially. If the magnetic field varies over time, then the MFM precession frequency will also vary over time. In MRI, magnetic fields are controlled to vary spatially and over time. Therefore, MFM precession frequencies can be tracked spatially and over time to understand the actual magnetic field present. Knowing the actual magnetic field present facilitates accommodating MRI acquisitions that are susceptible to even small perturbations in the magnetic field.

In one example, MFM probes may be configured with fluorine as a resonant species. In one magnetic field, the fluorine may experience nuclear magnetic resonance at 60.1 MHz. Therefore, the fluorine may be excited at 60.1 MHz, the gradient field turned on, and the resulting precession frequency identified in MFM signals acquired from the MFM probes. Since the precession frequency of a resonant species in a first probe is determined by the magnetic field present at the location of the first probe, the detected precession frequency accurately identifies the actual magnetic field present at the first probe. Additionally, the precession frequency of a resonant species in a second probe is determined by the magnetic field present at the location of the second probe. The detected precession frequency accurately identifies the actual magnetic field present at the second probe. While two point determinations associated with two probes are interesting, understanding the relationship between the two point determinations provides additional information.

Consider that a gradient field may be expected to vary in a known way (e.g., linearly) throughout a region. Having data about the actual field present at two points along the path upon which the gradient is to vary linearly facilitates identifying the actual magnetic field present at other points along that path. The magnetic field can be known both instantaneously and as it changes over time.

MFM can calculate magnetic field dynamics. For example the dynamics of a magnetic field B $\{|B(r, t)|\}$ could be examined by measuring the phase evolution $\{\phi(t)\}$ of multiple free induction signal decays at discrete probe locations (r): according to $$\gamma = \int_0^t |B(r, r)| \, dt = \varphi(t)$$

FIG. 1 illustrates an example circuit employed in wireless magnetic field monitoring (wMFM). Windings 104 (e.g., copper) are wound around an object 102 (e.g., glass capillary tube) to facilitate transmitting and receiving RF signals. Whether the windings 104 are used for transmitting or receiving is controlled by a transmit/receive switch 106. When transmitting, the windings 104 may be provided with an RF signal (e.g., 60.1 MHz) from an RF signal source 110. When receiving, windings 104 may provide a received signal to an analog signal mixer 124. The received signal may be, for example, 60.1 MHz plus or minus an amount determined by a gradient field. The analog signal mixer 124 may also have available a carrier frequency 120. The multiplied signal produced by analog mixer 124 may be provided to a filter (e.g., low pass filter 126) to achieve single sideband modulation. The resulting modulated signal can be wirelessly transmitted through antenna 130.

Figure 2:
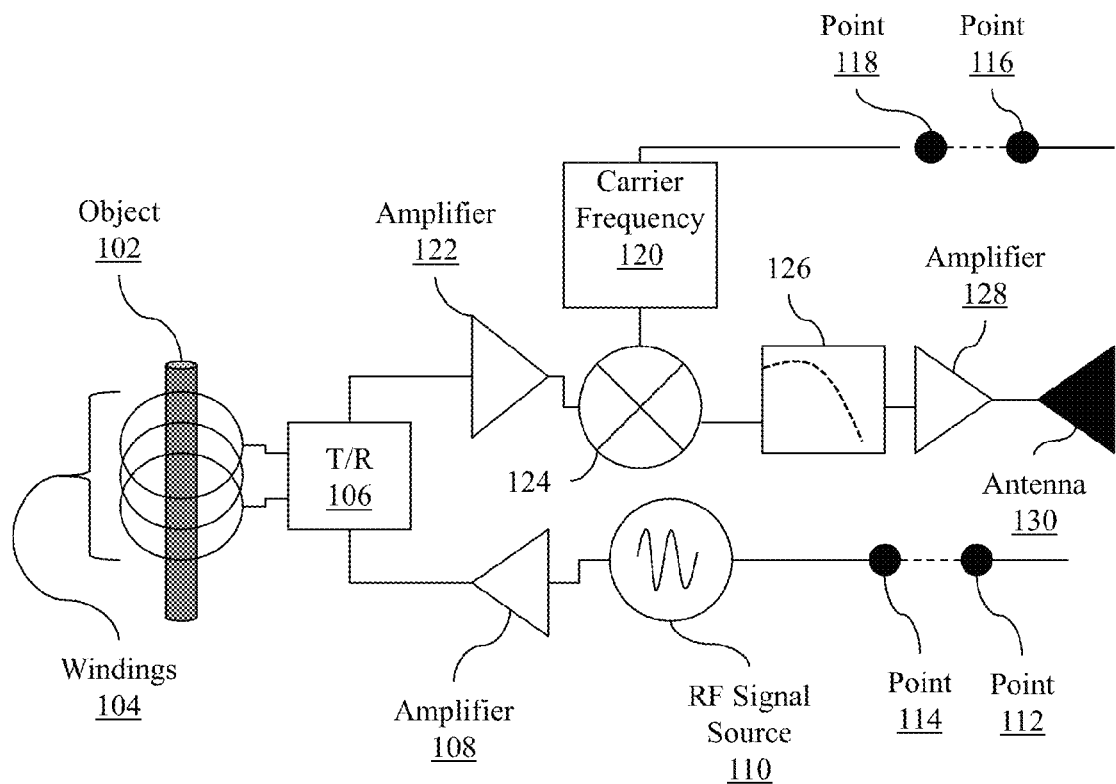
FIG. 2 illustrates an example circuit employed in wMFM.

FIG. 2 illustrates another example circuit employed in wMFM. This circuit also includes amplifiers 108, 122, and 128. Additionally, this circuit also includes an input path that crosses points 112 and 114. The input path may receive signals (e.g., control signals, synchronization signals) from an NMR apparatus. This circuit also includes a second input path that crosses points 116 and 118. This second input path may receive a carrier wave to be used by analog signal mixer 124. While FIGS. 1 and 2 illustrate two different circuits, one skilled in the art will appreciate that other circuits may be fabricated from different combinations of components that can create NMR excitation in an MFM probe, that can acquire MFM signals from the MFM probe, that can prepare (e.g., modulate) the acquired signal to be wirelessly transmitted to an MRI apparatus, and that can transmit the modulated signal.

Figure 3:
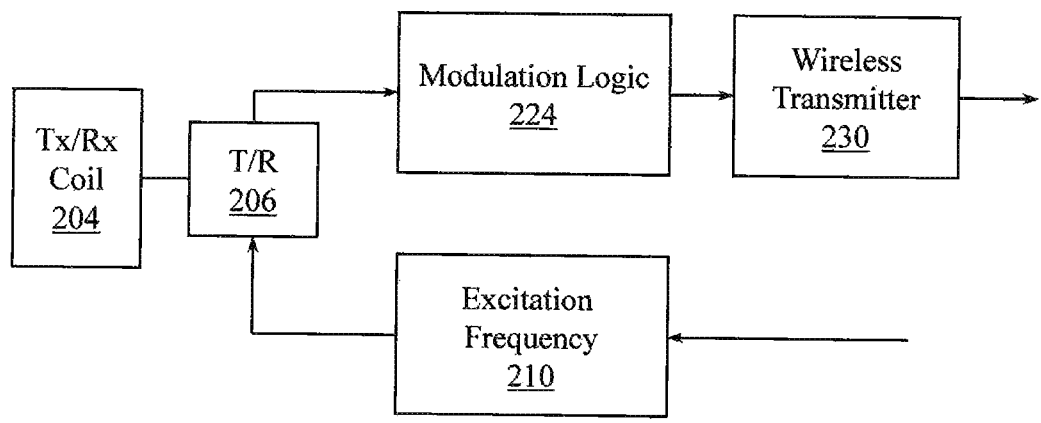
FIG. 3 illustrates an example apparatus employed in wMFM.

Thus, FIG. 3 illustrates more generally an apparatus employed in wMFM. The apparatus includes a transmit/receive coil 204 connected to a transmit/receive control 206. The transmit/receive control 206 may have available an excitation frequency provided by an excitation frequency provider 210. The transmit/receive control 206 may also be configured to provide received MFM signals to a modulation logic 224. The modulation logic 224 is in turn configured to provide the modulated MFM signals to a wireless transmitter 230.

Figure 4:
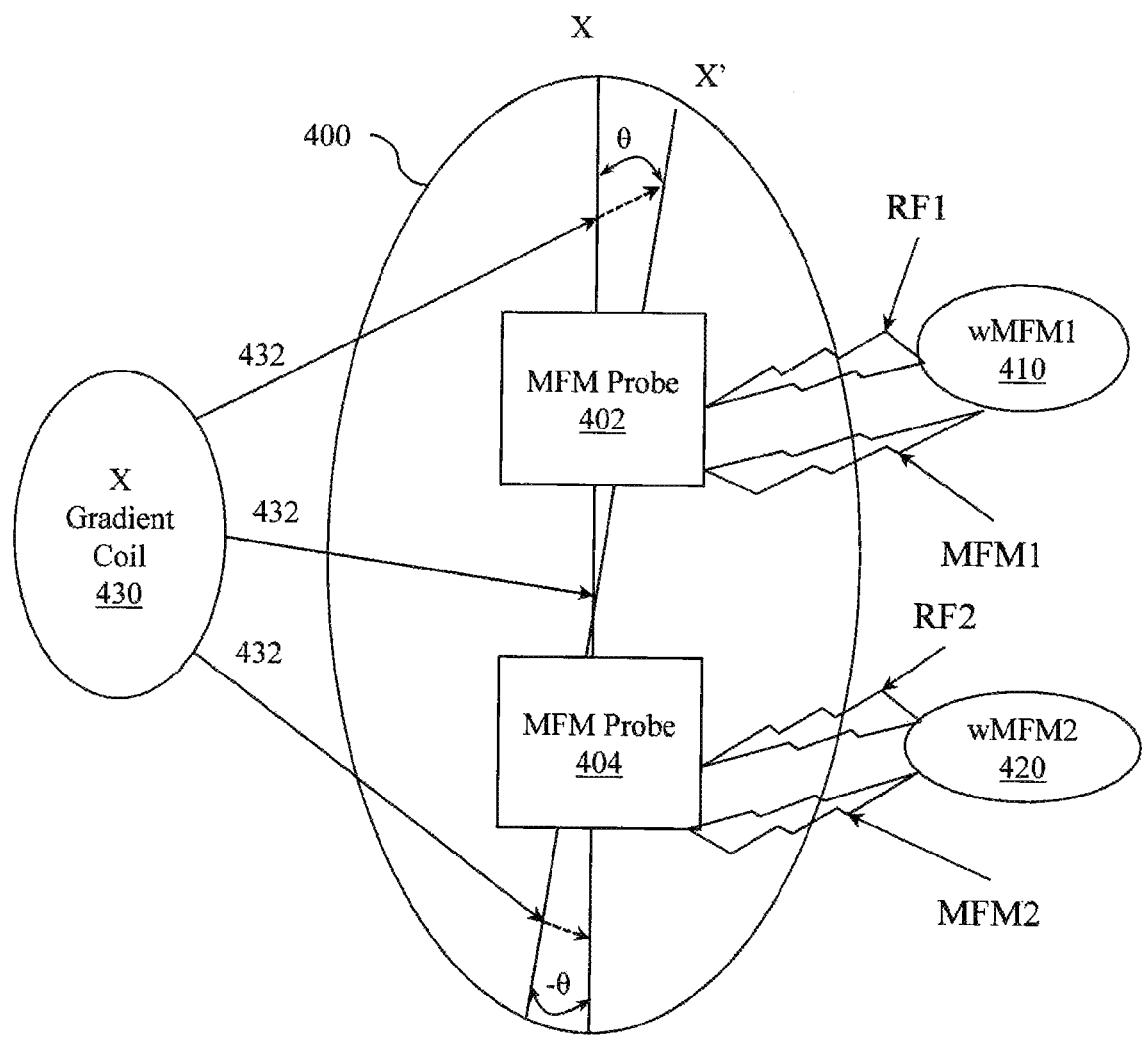
FIG. 4 illustrates MFM probes interacting with wMFM circuits.

FIG. 4 illustrates MFM probes 402 and 404 that are positioned in a main magnetic field 400. The main magnetic field 400 determines the Larmor frequency of the resonant species in the MFM probes 402 and 404. MFM probe 402 may be excited, for example, by radio frequency energy RF1 produced by wMFM module wMFM1 410. Similarly, MFM probe 404 may be excited, for example, by radio frequency energy RF2 produced by wMFM module wMFM2 420. MFM probe 402 may produce MFM signal MFM1. The frequency of MFM signal MFM1 will be determined by the magnetic field present at MFM probe 402. Similarly, MFM probe 404 may produce MFM signal MFM2. The frequency of MFM signal MFM2 will be determined by the magnetic field present at MFM probe 404. When the only magnetic field present is main magnetic field 400, then it is likely that the frequency of MFM1 and MFM2 will be the same.

FIG. 4 also illustrates an X gradient coil 430. X gradient coil 430 can produce a spatially varying gradient magnetic field. Field lines 432 represent the gradient magnetic field. The gradient may cause the overall magnetic field to increase at the top of magnetic field 400 and may cause the overall magnetic field to decrease at the bottom of magnetic field 400. The increase is illustrated with a positive angle $\theta$ between the lines X and X', where X represents the magnetic field with no X gradient magnetic field and X' represents the magnetic field with the X gradient magnetic field. Similarly, the decrease is illustrated with a negative angle θ between the lines X and X'. MFM probes 402 and 404 report the actual magnetic field at their location. The actual magnetic field can be discerned from the frequencies of MFM1 and MFM2.

Figure 5:
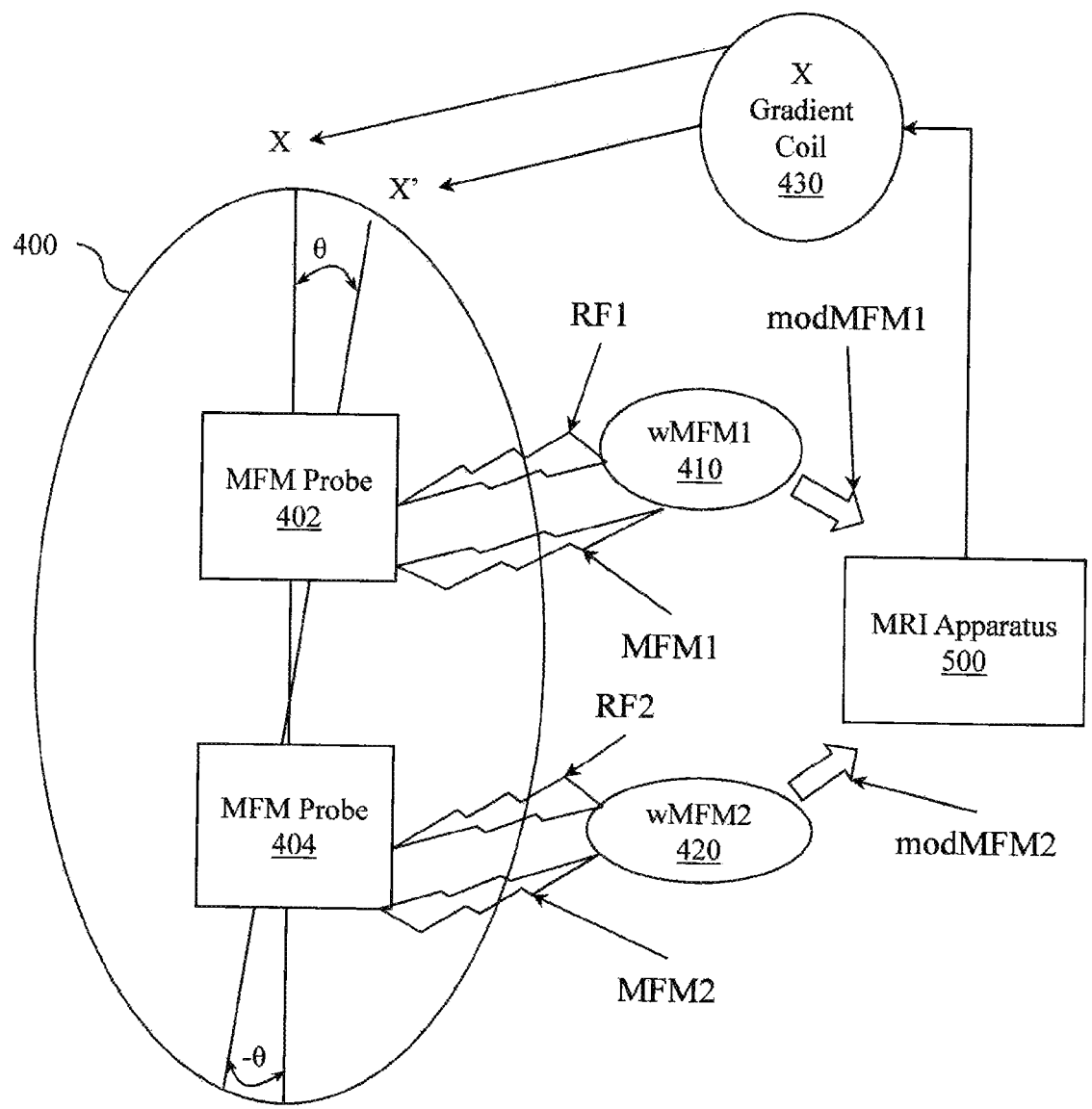
FIG. 5 illustrates MFM probes interacting with wMFM circuits that interact with an MRI apparatus.

FIG. 5 illustrates MFM module wMFM1 410 providing a modulated MFM signal modMFM1 to an MRI apparatus 500. FIG. 5 also illustrates MFM module wMFM2 420 providing a modulated MFM signal modMFM2 to the MRI apparatus 500. The modulated MFM signals modMFM1 and modMFM2 are provided wirelessly to the MRI apparatus 500. When coordinated by example apparatus, methods, and circuits described herein, the signals modMFM1 and modMFM2 facilitate producing improved MRI images that are less susceptible to gradient field perturbations.

Figure 6:
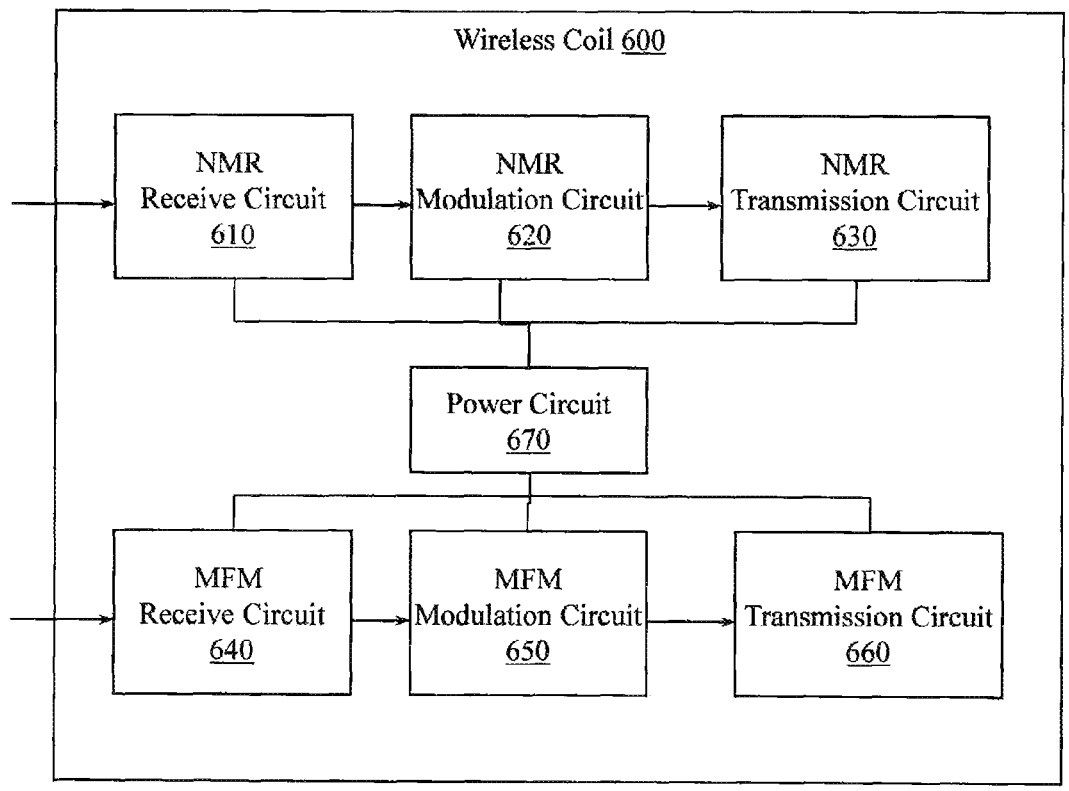
FIG. 6 illustrates a wMFM circuit co-located with a conventional wireless coil.

FIG. 6 illustrates a wMFM circuit co-located with a conventional wireless coil 600. The wireless coil 600 may include an NMR receive circuit 610, an NMR modulation circuit 620, and an NMR transmission circuit 630. Circuits 610, 620, and 630 may be configured to receive NMR signals, to modulate the signals for wireless transmission to an MRI apparatus, and to transmit the modulated signals to the MRI apparatus. The wMFM circuit may also include an MFM receive circuit 640, an MFM modulation circuit 650, and an MFM transmission circuit 660. Circuits 640, 650, and 660 may be configured to receive MFM signals, to modulate the signals for wireless transmission to the MRI apparatus, and to transmit the modulated MFM signals to the MRI apparatus. Since the circuits are located on the same wireless coil 600, the circuits may share some infrastructure (e.g., power circuit 670). While FIG. 6 illustrates two basically separate circuits, some example circuits may be more integrated into a wireless receive coil.

Figure 7:
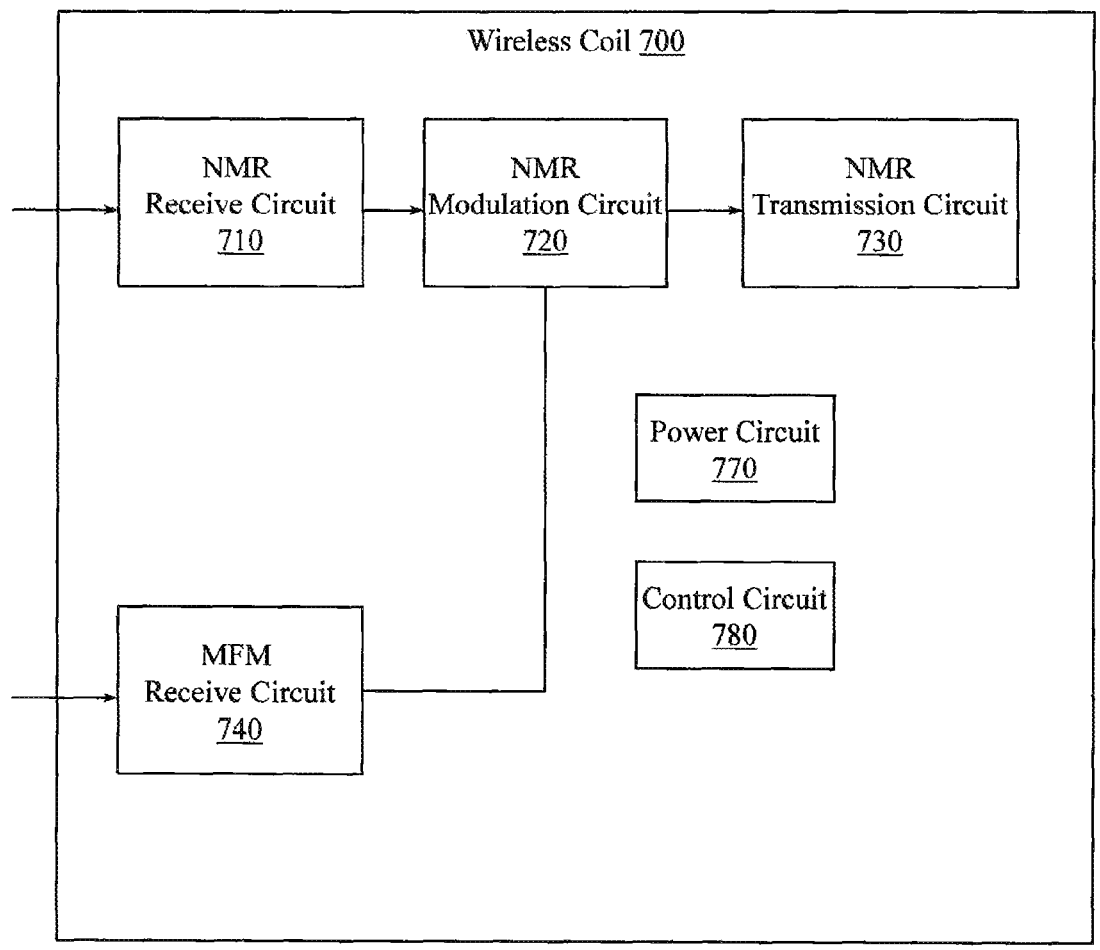
FIG. 7 illustrates a wMFM circuit integrated into a conventional wireless coil.

FIG. 7 illustrates a wMFM circuit that is more integrated into a wireless coil 700. Wireless coil 700 includes an NMR receive circuit 710 for receiving NMR signals from an object to be imaged. The NMR signals that are intended for reconstruction may be provided to an NMR modulation circuit 720 that prepares the signals to be wirelessly transmitted to an MRI apparatus. The prepared signals may be wirelessly transmitted to the MRI apparatus using NMR transmission circuit 730. Coil 700 may also include an MFM receive circuit 740. Instead of having separate modulation and transmission circuits, coil 700 may be configured with a single modulation circuit 720 that can process both NMR signals from circuit 710 and MFM signals from circuit 740. Similarly, transmission circuit 730 may be configured to transmit both NMR signals and MFM signals. In one embodiment, the circuits on wireless coil 700 may be powered by, for example, a single power circuit 770 or may be controlled by, for example, a single control circuit 780.

While NMR receive circuits 610 and 710 are illustrated, and while MFM receive circuits 640 and 740 are illustrated, in different embodiments, wireless coils may be configured to transmit and receive using the circuits 610, 710, 640, or 740.

Some portions of the detailed descriptions that follow are presented in terms of algorithms and symbolic representations of operations on data bits within a memory. These algorithmic descriptions and representations are used by those skilled in the art to convey the substance of their work to others. An algorithm is considered to be a sequence of operations that produce a result. The operations may include creating and manipulating physical quantities that may take the form of electronic values. Creating or manipulating a physical quantity in the form of an electronic value produces a concrete, tangible, useful, real-world result.

It has proven convenient at times, principally for reasons of common usage, to refer to these signals as bits, values, elements, symbols, characters, terms, and numbers. It should be borne in mind, however, that these and similar terms are to be associated with the appropriate physical quantities and are merely convenient labels applied to these quantities. Unless specifically stated otherwise, it is appreciated that throughout the description, terms including processing, computing, and determining, refer to actions and processes of a computer system, logic, processor, or similar electronic device that manipulates and transforms data represented as physical quantities (e.g., electronic values).

Example methods may be better appreciated with reference to flow diagrams. For simplicity, the illustrated methodologies are shown and described as a series of blocks. However, the methodologies may not be limited by the order of the blocks because, in some embodiments, the blocks may occur in different orders than shown and described. Moreover, fewer than all the illustrated blocks may be required to implement an example methodology. Blocks may be combined or separated into multiple components. Furthermore, additional or alternative methodologies can employ additional, not illustrated blocks.

Figure 8:
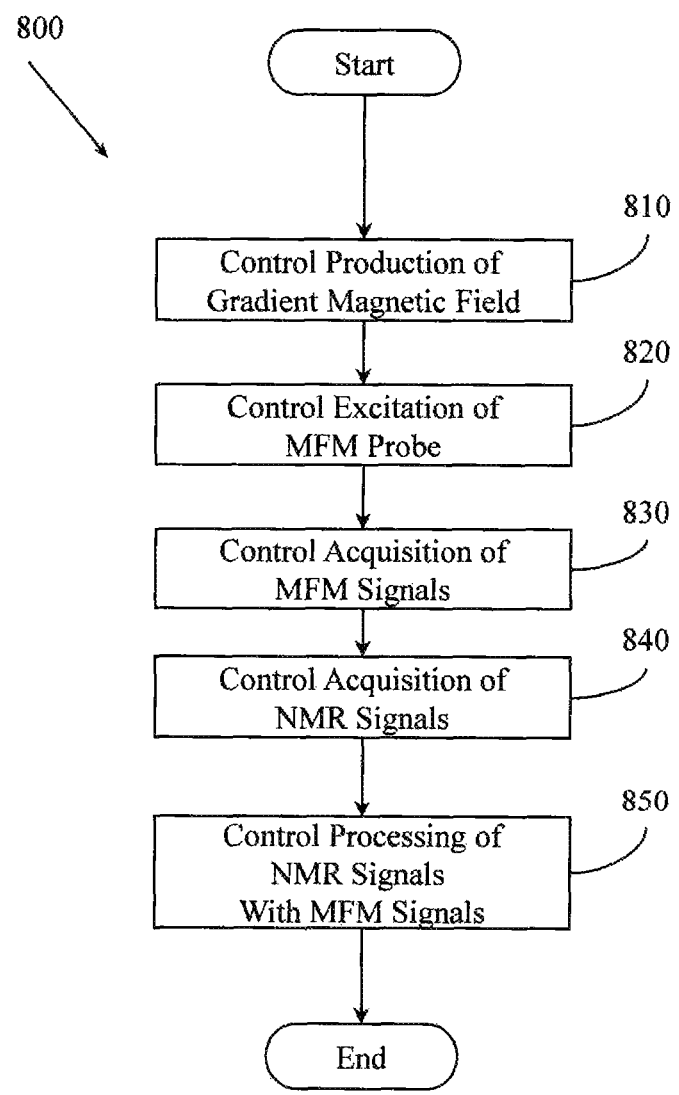
FIG. 8 illustrates an example method associated with wMFM.

FIG. 8 illustrates an example method 800 associated with wMFM. Method 800 includes, at 810, controlling an NMR apparatus to selectively produce a gradient magnetic field. Different gradient coils can produce different gradient magnetic fields at different times. Therefore, controlling the production of the gradient magnetic field may include controlling a $G_X$ gradient coil, a $G_Y$ gradient coil, or a $G_Z$ gradient coil, alone or in combination. Controlling the NMR apparatus to selectively produce a gradient magnetic field may include, for example, controlling a gradient coil to be turned off, controlling a gradient coil to be turned on, providing an RF excitation signal to the gradient coil, and other actions.

Method 800 also includes, at 820, controlling the NMR apparatus to cause NMR in resonant species in two or more MFM probes. In one example, the NMR may be caused while the gradient magnetic field is not being produced.

In another example, the NMR may be caused while the gradient magnetic field is being produced. The MFM probes will have been positioned to be affected by the gradient magnetic field. In one example, two MFM probes may be positioned in a line in plane (e.g., slice) to be processed by an MRI apparatus. In another example, the MFM probes may be positioned in a line that intersects several planes (e.g., slices) to be processed by an MRI apparatus. In another example, three MFM probes may be positioned in a plane to be processed by an MRI apparatus. In yet another example, eight MFM probes may be positioned in a cube or sphere arrangement to cover two or more planes (e.g., slices) to be processed by an MRI apparatus. Other numbers of MFM probes may be positioned in other arrangements.

Method 800 also includes, at 830, controlling the NMR apparatus to acquire MFM signals from the MFM probes while the gradient magnetic field is being produced. Acquiring the MFM signals may include receiving un-modulated MFM signals in a set of receive coils and then processing (e.g., modulating) the un-modulated MFM signals into modulated MFM signals. The modulating may include, for example, single side band modulation, amplitude modulation, frequency modulation, or other modulations.

Once the modulated signal has been produced, the MFM signals may be wirelessly transmitted to the NMR apparatus.

In one example, acquiring the MFM signals may include measuring or characterizing the dynamics of the magnetic field. In this example, method 800 may include measuring the phase evolution φ(t) of free induction signal decays at locations of the two or more MFM probes according to:

$$\gamma = \int_0^t |B(r_1, r_2)| dt = \varphi(t)$$

where: γ is the gyromagnetic ratio, B is the magnetic field, r is a probe location, and Φ is the phase evolution.

Method 800 also includes, at 840, controlling the NMR apparatus to acquire NMR signals from the object to be processed while the gradient magnetic field is being produced. The acquired NMR signals may be provided to the same NMR apparatus as the MFM signals. Since the NMR signals are acquired contemporaneously with the MFM signals, the MFM signals may be useful to a more accurate reconstruction that is less affected by perturbation artifacts.

Thus, method 800 also includes, at 850, controlling the NMR apparatus to process the NMR signals based, at least in part, on the MFM signals. In one example, the NMR apparatus is an MRI apparatus and thus the NMR signals are intended to be reconstructed into an image. In this example, processing the NMR signals includes reconstructing an MR image suitable for viewing based, at least in part, on the MFM signals. Thus, processing the NMR signals may include using the MFM signals in a reconstruction.

In one example, the MFM probes may have been configured with a resonant species (e.g., Fluorine) that is not expected to be found in the object to be imaged. This facilitates decoupling MFM signals from NMR signals intended for image reconstruction. While Fluorine is described, it is to be appreciated that different MFM probes may be configured with different resonant species. Additionally, different MFM probes used together in a single MFM procedure may include different resonant species and an MFM probe may be configured with multiple resonant species.

MFM probes may be placed according to a strategy. The strategy may depend, for example, on a property of a receive array to be used to acquire the NMR signals. Even though multiple MFM probes may be positioned and available for excitation, in one example, method 800 may include selectively activating only a desired number of the available probes based, at least in part, on an amount of image correction desired. For example, a first receive array and a first image acquisition may require a first amount of image correction and thus may activate a first number of MFM probes while a second receive array and a second image acquisition may require a second, different amount of image correction and thus may activate a second, different number of MFM probes. With different number of probes being available for selective activation, in one example method 800 may include controlling the NMR apparatus to process the NMR signal in light of the MFM to correct up to first order field perturbation effects in the NMR signal.

Figure 9:
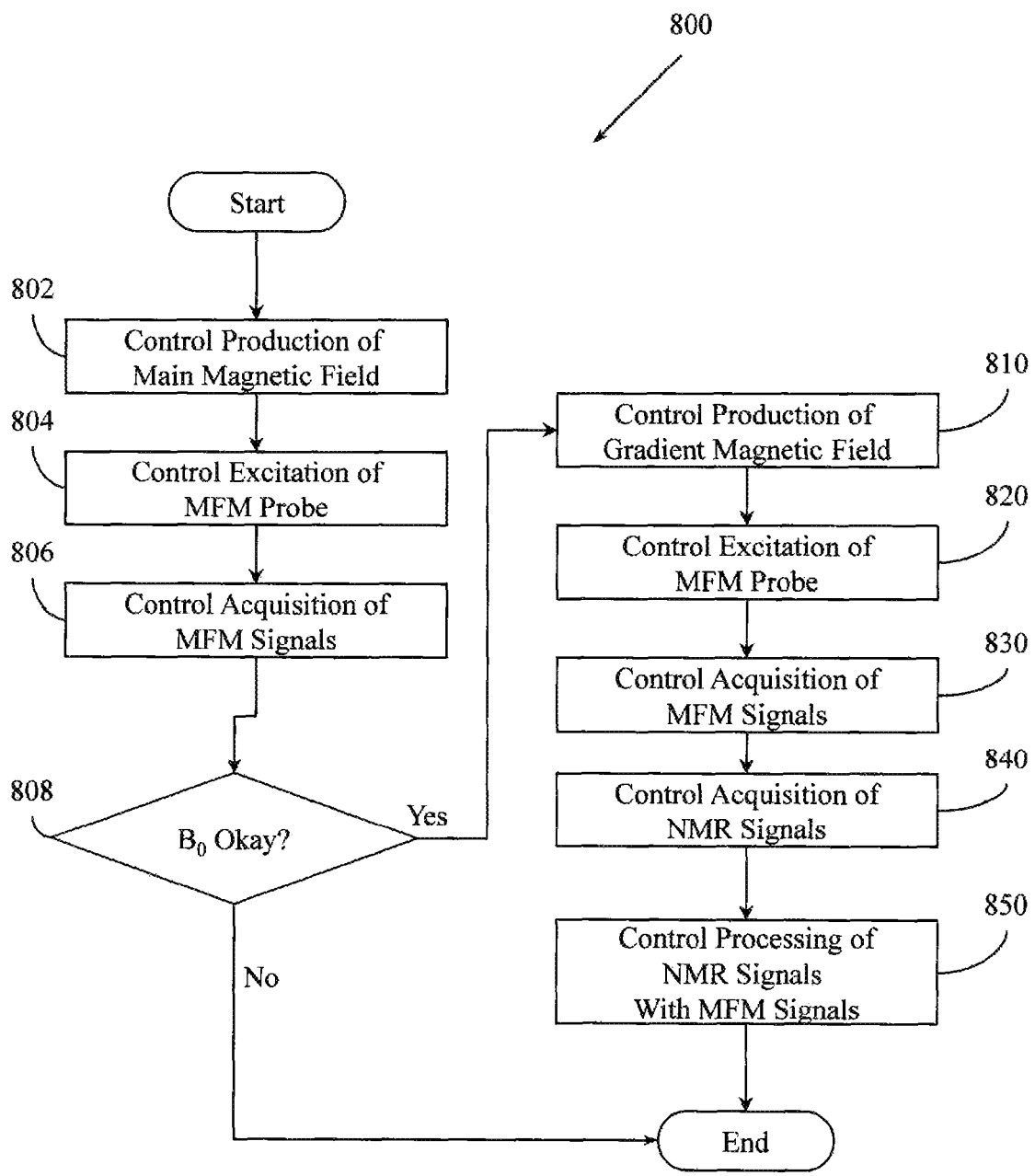
FIG. 9 illustrates an example method associated with wMFM.

FIG. 9 illustrates another embodiment of example method 800. This embodiment includes actions 810, 820, 830, 840, and 850 but also includes some initial actions that may be used to calibrate an NMR apparatus or to insure that an MRI apparatus is operating within an acceptable performance range before engaging in an acquisition.

This embodiment of method 800 includes, at 802, controlling the NMR apparatus to apply a main magnetic field $B_0$ and then, at 804, controlling the excitation of an MFM probe by selectively providing RF energy at an excitation frequency. If the main magnetic field $B_0$ is acceptably uniform and in an acceptable state then MFM probes positioned in the $B_0$ field ought to be excited and ought to produce the same MFM signals.

This embodiment of method 800 therefore also includes, at 806, controlling the NMR apparatus to acquire calibration MFM signals from the two or more MFM probes while the main magnetic field $B_0$ is applied and while the gradient magnetic field is not applied. In one example, acquiring the calibration MFM signals includes receiving un-modulated calibration MFM signals in the set of receive coils and processing the un-modulated calibration MFM signals into modulated calibration MFM signals. Once the modulated calibration signals have been produced, they may then be wirelessly transmitted to the NMR apparatus.

This embodiment of method 800 also includes, at 808, making a determination concerning whether the calibration MFM signals indicate that the $B_0$ field is in a desired state. If the determination at 808 is that the $B_0$ field is not in a desired state, then method 800 may include selectively controlling the NMR apparatus to not collect NMR signals. The determination may be based, for example, on a field parameter (e.g., homogeneity) that may be measured using MFM. While calibrating the $B_0$ field is described, method 800 may also be employed to selectively produce a gradient magnetic field and then evaluate a property (e.g., homogeneity, linear variance, coverage) of that field. In this example, method 800 includes selectively controlling the NMR apparatus to not engage in an acquisition when a property of the magnetic field falls outside a desired range.

Figure 10:
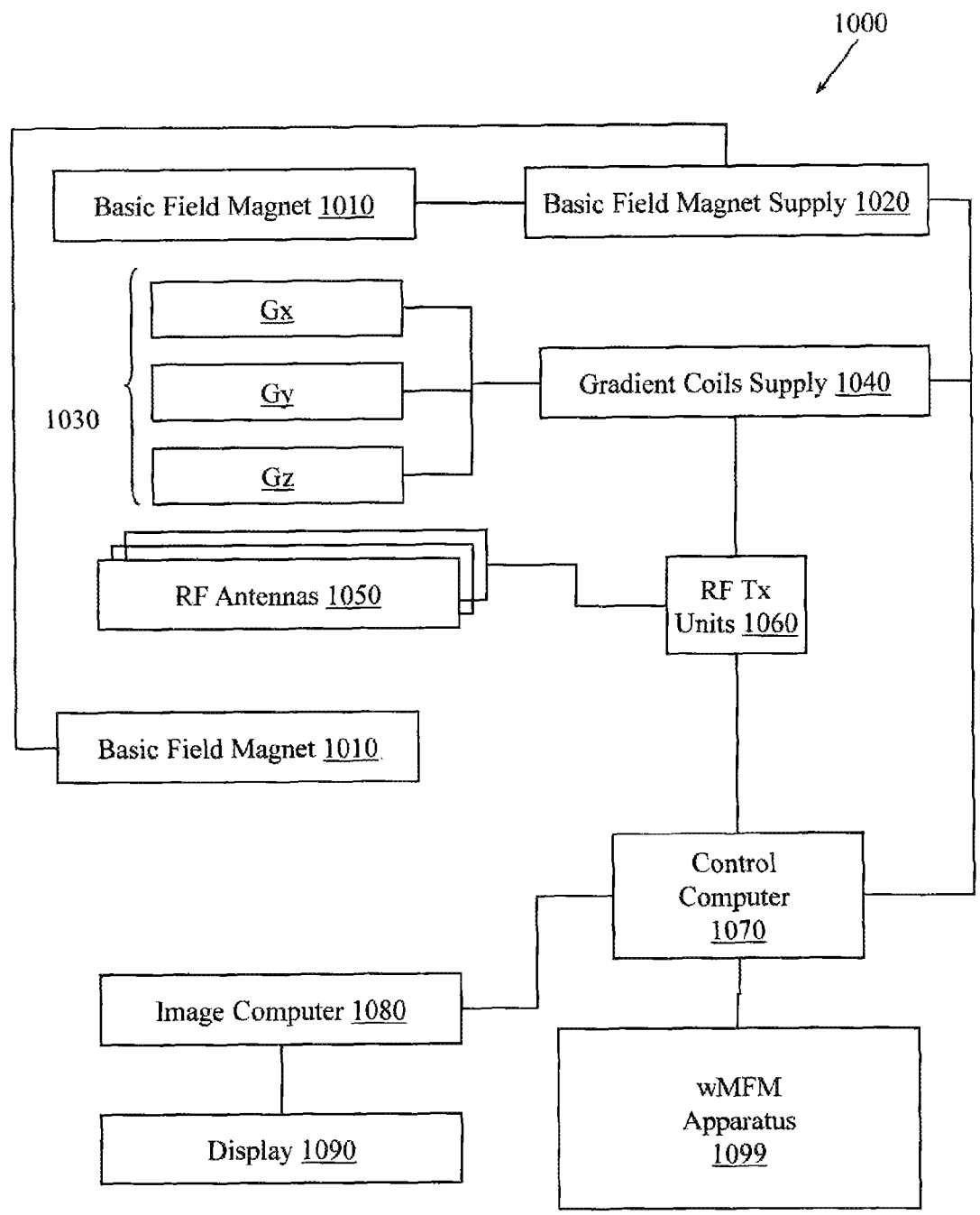
FIG. 10 illustrates an MRI apparatus.

FIG. 10 illustrates an example MRI apparatus 1000 configured with a wMFM apparatus 1099 for performing wireless MFM. The wMFM apparatus 1099 may be configured with elements of example apparatus or circuits described herein or may perform example methods described herein. In one embodiment, apparatus 1099 may provide means for creating NMR in an MFM probe, acquiring MFM signals from the MFM probe, and automatically correcting NMR signals intended for image reconstruction using the MFM signals. The means may include, for example, circuits, programmed logics, and a special purpose computer.

The apparatus 1000 includes a basic field magnet(s) 1010 and a basic field magnet supply 1020. Ideally, the basic field magnets 1010 would produce a uniform $B_0$ field. However, in practice, the $B_0$ field may not be uniform, and may vary over an object being imaged by the MRI apparatus 1000. MRI apparatus 1000 may include gradient coils 1030 configured to emit gradient magnetic fields like $G_S$, $G_P$, and $G_R$ or Gx, Gy, and Gz. The gradient coils 1030 may be controlled, at least in part, by a gradient coils supply 1040. In some examples, the timing, strength, and orientation of the gradient magnetic fields may be controlled, and thus selectively adapted, during an MRI procedure. Ideally the actual gradient magnetic fields produced would perfectly faithfully represent the desired gradient magnetic fields and would vary perfectly regularly with no perturbations. Since these ideals may not be attained, wMFM is configured to acquire actual magnetic field information.

MRI apparatus 1000 may include a set of RF antennas 1050 that are configured to generate RF pulses and to receive resulting NMR signals from an object to which the RF pulses are directed. In one embodiment, the RF antennas 1050 are arranged as an array of parallel transmission coils that are individually controllable. How the pulses are generated and how the resulting MR signals are received may be controlled and thus may be selectively adapted during an MR procedure. Separate RF transmission and reception coils can be employed. The RF antennas 1050 may be controlled, at least in part, by a set of RF transmission units 1060. An RF transmission unit 1060 may provide a signal to an RF antenna 1050. The RF transmission unit 1060 may provide different signals to different RF antennas to produce different RF excitations from the different members of the array of parallel transmission coils. The RF receive coils may wirelessly provide both NMR signals intended for image reconstruction and NMR MFM signals to, for example, control computer 1070 or wMFM apparatus 1099.

The gradient coils supply 1040 and the RF transmission units 1060 may be controlled, at least in part, by a control computer 1070. In one example, the control computer 1070 may be programmed to control an NMR device as described herein. Conventionally, the magnetic resonance signals received from the RF antennas 1050 can be employed to generate an image and thus may be subject to a transformation process like a two dimensional Fast Fourier Transform (FFT) that generates pixilated image data. The transformation can be performed by an image computer 1080 or other similar processing device. The image data may then be shown on a display 1090. Since the NMR signals intended for reconstruction and the MFM signals describing actual magnetic field conditions are acquired contemporaneously and provided contemporaneously, the reconstruction can proceed with actual magnetic field strength information instead of theoretical magnetic field strength information.

Figure 12:
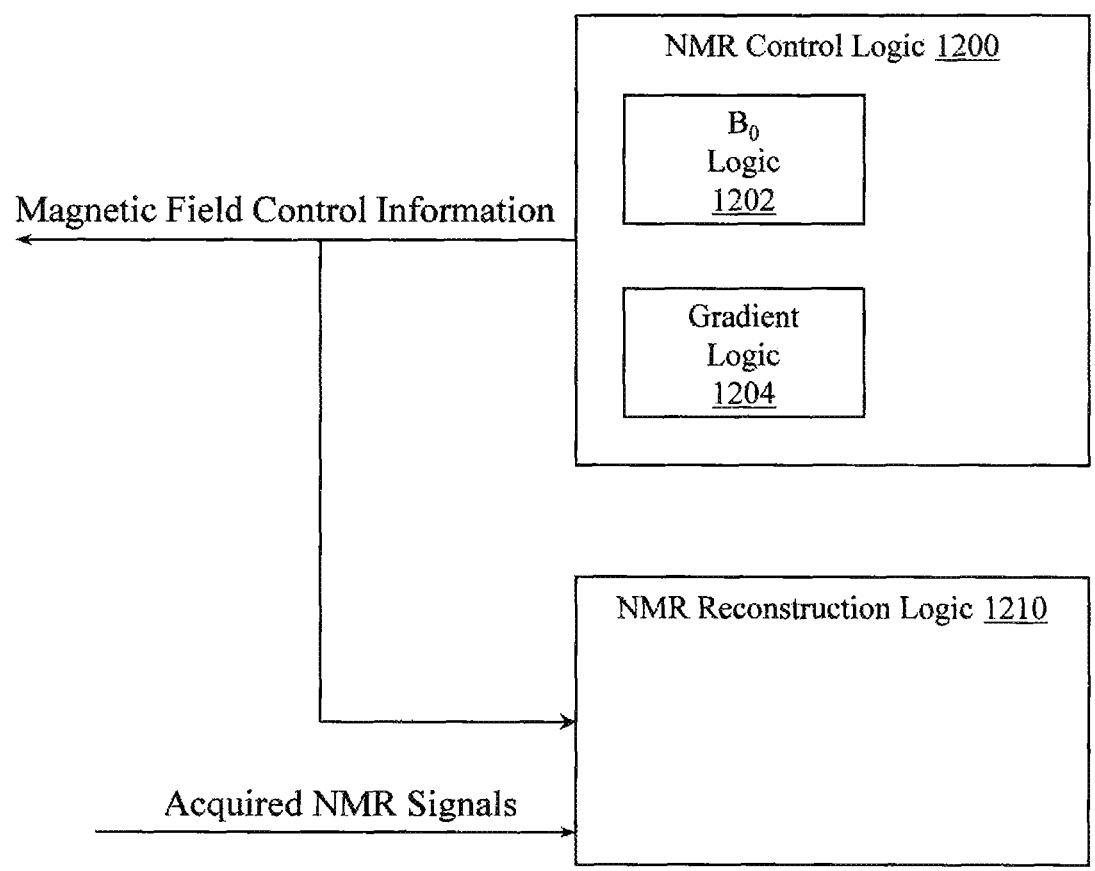
FIG. 12 illustrates a conventional MRI reconstruction logic.
Figure 13:
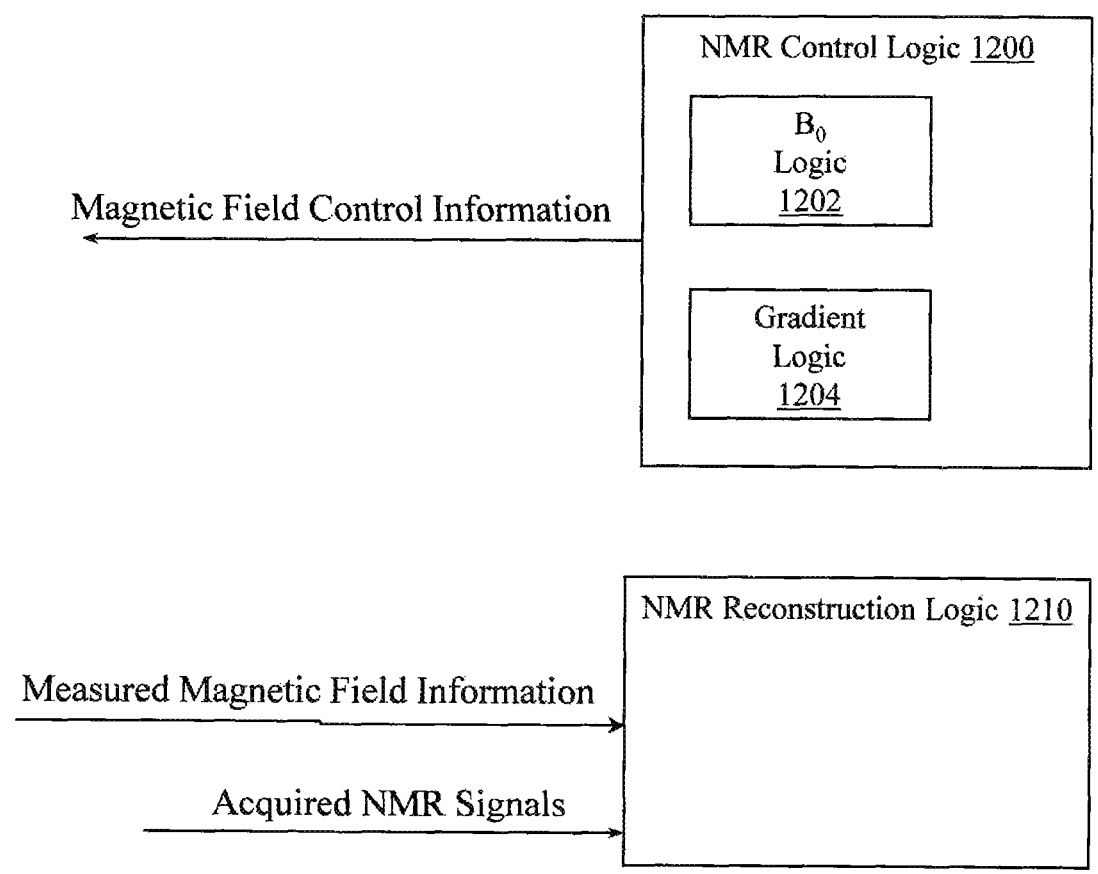
FIG. 13 illustrates an example MRI reconstruction logic.

While FIG. 10 illustrates an example MRI apparatus 1000 that includes various components connected in various ways, it is to be appreciated that other MRI apparatus may include other components connected in other ways. Consider the difference between the situations illustrated in FIGS. 12 and 13. In FIG. 12 an NMR control logic 1200 has a $B_0$ logic 1202 and a gradient logic 1204. Conventionally, the $B_0$ logic 1202 would provide information for controlling the $B_0$ field and the gradient logic 1204 would provide information about controlling gradient magnetic field(s). This information would be provided both to circuits that control magnetic field production and to NMR reconstruction logic 1210. In FIG. 13, NMR control logic 1200 still provides the $B_0$ information and the gradient magnetic field information. However, instead of the NMR reconstruction logic 1210 relying on the control information, the NMR reconstruction logic 1210 relies on actual magnetic field information measured and provided by wMFM systems, apparatus, circuits, or methods. Since the reconstruction depends on information about the magnetic field, the NMR reconstruction logic 1210 in FIG. 13 may produce superior results to that of FIG. 12.

Thus, apparatus 1000 may be part of an MRI system that includes a plurality of wireless MFM modules that are configured to receive MFM signals from a plurality of MFM probes and to wirelessly transmit modulated MFM signals produced from the received MFM signals. Apparatus 1000 may also include a wireless receiver that is configured to receive the wirelessly transmitted modulated MFM signals and to process the modulated MFM signals into magnetic field measurement information. The magnetic field measurement information can then be made available for real-time reconstruction of an MRI signal. Therefore, apparatus 1000 may include an MRI reconstruction logic in, for example, wMFM apparatus 1099 or image computer 1080. The MRI reconstruction logic may be configured to produce an MR image from the MRI signal based, at least in part, on the magnetic field measurement information rather than from presumed magnetic field information.

Since MFM signals are to be acquired in a time frame relevant to the acquisition of NMR signals from which MRI images can be reconstructed, apparatus 1000 may also include a synchronization logic that is configured to synchronize MFM probe excitation, MFM signal acquisition, and, an NMR pulse sequence associated with acquiring MRI signals intended for image reconstruction.

Figure 11:
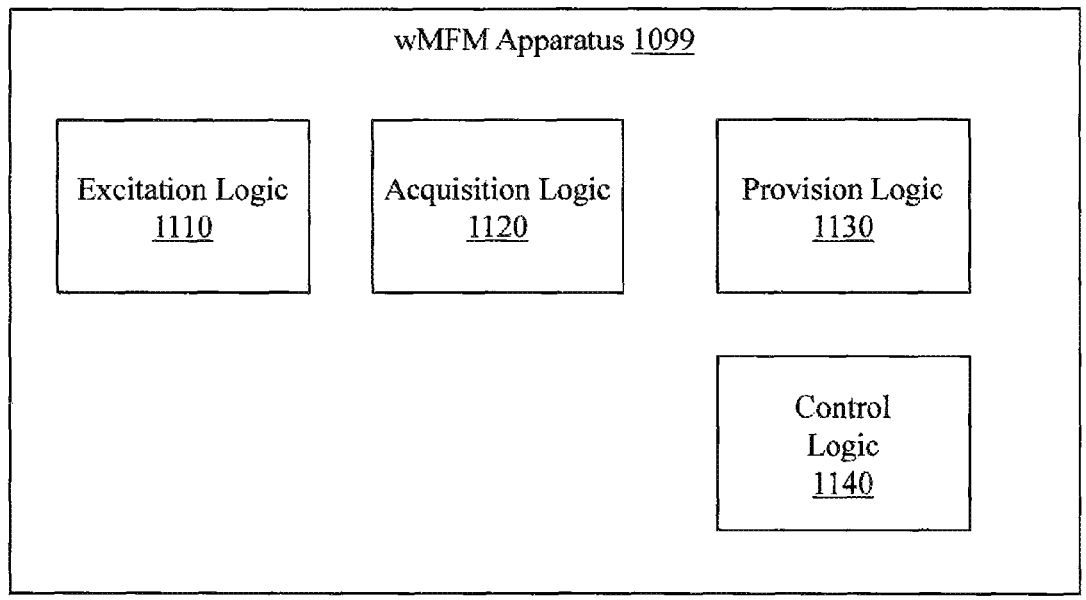
FIG. 11 illustrates a portion of an MRI apparatus.

FIG. 11 illustrates an embodiment of a wireless MFM apparatus 1099. Apparatus 1099 may be a computer, electronic, or other apparatus that is configured to control an MRI apparatus (e.g., apparatus 1000) to produce, acquire, or use MFM information. Apparatus 1099 may include an excitation logic 1110 that is configured to control excitation of a resonant species in an MFM probe. Controlling excitation may include controlling an RF signal source that produces an RF signal for exciting an MFM probe and controlling a transmit coil that applies the RF signal to the MFM probe.

Apparatus 1099 may also include an acquisition logic 1120 that is configured to control acquisition of MFM signals produced by the excited MFM probe. Controlling acquisition may include controlling a receive coil. Controlling the receive coil may include, for example, tuning the receive coil to a resonant frequency associated with an MFM probe. The receive coil receives an MFM signal from an MFM probe.

Apparatus 1099 may also include a provision logic 1130 that is configured to provide the MFM signals to an apparatus that will process contemporaneously acquired NMR signals intended for reconstruction. The provision logic 1130 may control a modulator that is configured to input the MFM signal received by receive coil and to output a modulated MFM signal. In one example, the modulator may be an analog signal mixer that encodes the MFM signal using a carrier frequency and modulation techniques including, but not limited to, single side band modulation, amplitude modulation, frequency modulation, and frequency division modulation. The provision logic 1130 may also control a transmitter that is configured to wirelessly provide the modulated MFM signal.

Apparatus 1099 may also include a control logic 1140 that is configured to control the operations of logic 1110, 1120, and 1130. Controlling the logics may include coordinating their activity with that of the MRI apparatus. For example, the MFM probes may be excited at one point in an acquisition and then may be listened to during another point(s) in the acquisition.

In one embodiment, apparatus 1099 may be a circuit that is located on a receive coil in an NMR apparatus. In another embodiment, apparatus 1099 may be a circuit operably connected to and sharing at least one component with a wireless receive coil in an NMR apparatus. While separate receive coils and transmit coils are described, one skilled in the art will appreciate that in one embodiment the receive coil and the transmit coil may be the same coil. When the same coil can function as both the transmit and receive coil, apparatus 1099 may also include a transmit/receive switch that is configured to selectively control whether the wMFM apparatus is in a transmit mode or a receive mode. In one embodiment, the transmit/receive switch may be controllable by an NMR apparatus to facilitate coordinating MFM probe excitation and MFM signal acquisition with an MRI pulse sequence configured to produce NMR signals intended for reconstruction.

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a non-transitory medium that stores signals, instructions or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, or combinations of each to perform a function(s) or an action(s), or to cause a function or action from another logic, method, or system. Logic may include a software controlled microprocessor, a discrete logic (e.g., ASIC), an analog circuit, a digital circuit, a programmed logic device, a memory device containing instructions, and other devices. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, or logical communications may be sent or received. An operable connection may include a physical interface, an electrical interface, or a data interface. An operable connection may include differing combinations of interfaces or connections sufficient to allow operable control. For example, two entities can be operably connected to communicate signals to each other directly or through one or more intermediate entities (e.g., processor, operating system, logic, software). Logical or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted or detected.

"User", as used herein, includes but is not limited to one or more persons, software, computers or other devices, or combinations of these.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, or ABC (e.g., the data store may store only A, only B, only C, A&B, A&C, B&C, or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A non-transitory computer-readable storage medium storing computer executable instructions that when executed by a computer, control the computer in order to perform a method of reconstructing a magnetic resonance image, comprising:

controlling a nuclear magnetic resonance (NMR) apparatus in order to selectively produce a gradient magnetic field, where the NMR apparatus is specifically an MRI apparatus;

controlling, during an MRI image acquisition, the NMR apparatus with the computer in order to cause NMR to occur in a resonant species of an object that is within a pre-determined distance of a plurality of magnetic field monitoring (MFM) probes, the plurality of MFM probes being positioned in order to be affected by the produced gradient magnetic field, where the plurality of MFM probes, has at least 8 MFM probes that are positioned in either a cube arrangement or a spherical arrangement in order to cover two or more MRI slice planes controlling, during the MRI image acquisition, the NMR apparatus in order to acquire MFM signals from the plurality of at least 8 MFM probes while the gradient magnetic field is being produced, where acquiring the MFM signals comprises:

receiving un-modulated MFM signals with a set of receive coils;

processing the received un-modulated MFM signals into modulated MFM signals, where processing the un-modulated MFM signals into modulated MFM signals comprises performing with the computer an amplitude modulating and a frequency division modulating of the received un-modulated MFM signals, and wirelessly transmitting the Amplitude and frequency division modulated MFM signals to the NMR MRI apparatus;

controlling the NMR apparatus substantially simultaneously with the wireless transmission of the Amplitude and frequency division modulated MFM signals to the NMR apparatus, in order to acquire NMR signals from an object undergoing an MRI scan while the gradient magnetic field is being produced, where the NMR signals are then reconstructed into a magnetic resonance image;

controlling the NMR apparatus with the computer in order to process the acquired NMR signals with the MFM signals, where processing the NMR signals includes reconstructing an MR image that is suitable for viewing from the MFM signals; and displaying the reconstructed MR image.

2. The non-transitory computer-readable storage medium of claim 1, comprising measuring the phase evolution $\phi(t)$ of free induction signal decays at locations of the plurality of at LEAST 8 MFM probes according to:

$$\gamma = \int_0^t |B(r_1, r_2)| dt = \varphi(t)$$

where:
γ is the gyromagnetic ratio,
B is the magnetic field,
r is a probe location, and
Φ is the phase evolution.

3. The non-transitory computer-readable storage medium of claim 1 comprising configuring the MFM probes with a resonant species that is not expected to be found in the object that is being imaged by the MRI apparatus.

4. The non-transitory computer-readable storage medium of claim 1, where the gradient magnetic field is produced by one or more of, a $G_x$ gradient coil, a $G_y$ gradient coil, and a $G_z$ gradient coil.

5. The non-transitory computer-readable storage medium of claim 1, the method comprising:
controlling the NMR apparatus with the computer in order to apply a main magnetic field $B_0$; and
controlling the NMR apparatus in order to acquire calibration MFM signals from the plurality of at least 8 MFM probes while the main magnetic field $B_0$ is applied and while the gradient magnetic field is not applied, where acquiring the calibration MFM signals comprises:
receiving un-modulated calibration MFM signals with the set of receive coils;
processing the un-modulated calibration MFM signals into modulated calibration MFM signals by performing amplitude and frequency modulation, and
wirelessly transmitting the modulated calibration MFM signals back to the NMR apparatus.

6. The non-transitory computer-readable storage medium of claim 5, comprising selectively controlling the NMR apparatus with the computer in order to not collect NMR signals upon determining that the calibration MFM signals indicate that a magnetic field property exceeds an acceptable threshold.

7. The non-transitory computer-readable storage medium of claim 1, comprising
selectively activating a desired number of the plurality of at least 8 MFM probes based, on an amount of image correction desired.

8. The non-transitory computer-readable storage medium of claim 1, where MFM signals are used in order to correct first order field perturbation effects in the NMR signal.

* * * * *